United States Patent [19]
Katisko

[11] Patent Number: 5,933,448
[45] Date of Patent: Aug. 3, 1999

[54] AUTOMATIC TUNING OF A RADIO TRANSCEIVER

[75] Inventor: Keijo Katisko, Oulu, Finland

[73] Assignee: Nokia Telecommunications Oy, Espoo, Finland

[21] Appl. No.: 08/817,653

[22] PCT Filed: Aug. 6, 1996

[86] PCT No.: PCT/FI96/00431

§ 371 Date: Apr. 4, 1997

§ 102(e) Date: Apr. 4, 1997

[87] PCT Pub. No.: WO97/06607

PCT Pub. Date: Feb. 20, 1997

[30] Foreign Application Priority Data

Aug. 7, 1995 [FI] Finland ..................... 953749

[51] Int. Cl.$^6$ ............................. H04B 7/005
[52] U.S. Cl. .................. 375/219; 375/278; 375/281; 375/284; 455/127; 455/522
[58] Field of Search ................. 375/219, 284, 375/285, 295, 296, 297, 278, 281; 332/103, 144, 145, 159; 455/73, 127, 226.1, 226.2, 232.1, 234.1, 245.1, 250.1, 522, 69; 330/149

[56] References Cited

U.S. PATENT DOCUMENTS

| | | |
|---|---|---|
| 4,926,443 | 5/1990 | Reich ............................. 375/349 |
| 4,943,982 | 7/1990 | O'Neil, II et al. ............. 375/327 |
| 5,309,429 | 5/1994 | Fukuda .......................... 370/280 |
| 5,355,101 | 10/1994 | Ichihara et al. ............... 332/103 |
| 5,371,481 | 12/1994 | Tittanen et al. ............... 332/103 |
| 5,396,190 | 3/1995 | Murata .......................... 330/149 |
| 5,453,714 | 9/1995 | Madsen ......................... 329/301 |
| 5,574,994 | 11/1996 | Huang et al. ................. 455/126 |
| 5,579,373 | 11/1996 | Jang ......................... 455/522 X |
| 5,628,059 | 5/1997 | Kurisu .......................... 455/126 |
| 5,699,383 | 12/1997 | Ichiyoshi ....................... 375/297 |
| 5,708,681 | 1/1998 | Malkemes et al. ............. 375/297 |
| 5,712,870 | 1/1998 | Petrick .......................... 375/206 |

FOREIGN PATENT DOCUMENTS 2 249 442 5/1992 United Kingdom.

*Primary Examiner*—Young T. Tse
*Attorney, Agent, or Firm*—Pillsbury Madison & Sutro LLP

[57] ABSTRACT

Amplitude and phase errors between branches I and Q of a transceiver utilizing phase quadrature modulation are corrected by preventing propagation of a nominal-frequency signal from a digital part through a loop part and a reception branch to an RSSI indicator by changing the frequency response of a component on the path of the signal. The same indicator that normally measures the payload signal, here measures only undesired signal components. After this, such amplitude and/or phase correction signals are determined with which the measuring result obtained from the indicator reaches the minimum. The resultant correction signals are stored in the memory, and the frequency response of the system is then restored to normal.

22 Claims, 4 Drawing Sheets

AUTOMATIC TUNING OF A RADIO TRANSCEIVER

This application is the national phase of international application PCT/FI96/00431, filed Aug. 6, 1996 which designated the U.S.

BACKGROUND OF THE INVENTION

1. Field of the Invention

The invention relates to a radio transmitter and especially to tuning of a transmitter used at a base station in a mobile telephone network.

2. Description of the Related Art

The invention will be discussed in connection with the GSM system, but it can naturally be used in other types of radio transceivers where applicable.

In Gaussian phase modulation used in the GSM system, a bit stream is modulated to a sine and a cosine component I, Q of a signal at a frequency here indicated by $f_1$. The bit stream is transmitted such that every other bit is forwarded in branch I and every other in branch Q. The phase difference between signals I and Q is 90°. If a signal entering one of the branches does not change, then the phase of the signal transmitted in that particular branch will not change. When the bit changes, the phase of the signal in that particular branch is shifted by 180°. FIG. 1 shows signals I and Q.

Signals I and Q are mixed to the transmission frequency in an IQ modulator, the basic circuit arrangement of which is shown in FIG. 2. A local oscillator LO having a frequency $f_{LO}$ is connected to the modulator.

FIG. 3 exemplifies a result of up-mixing. Graph A illustrates an ideal mixing result. In this particular case, the only significant signal of the spectrum of the mixing result is at frequency $f_{LO}+f_1$. Low-frequency signals can be seen at frequency $f_{LO}$ of the local oscillator LO and at image frequency $f_{LO}-f_1$ of frequency $f_1$. With some other bit combination, the latter frequency may be an effective frequency. Due to non-linearity of the components, the frequency response is in practice much more complicated, as illustrated by graph B in FIG. 3. Compared with ideal result A, the payload signal of result B is attenuated and the undesired mixing results are emphasized. Graphs C and D of FIG. 3 will be discussed later.

FIG. 4 is a block diagram of that part of a transceiver unit at a base station of the GSM system which is essential to the invention. A baseband unit 1 comprises a digital part 10, which divides digital data D into bit streams $D_I$ and $D_Q$, which correspond to signals I and Q. The bit streams are converted into analogue signals I and Q with D/A converters 12 and 14. The output signals of the converters are filtered with low-pass filters (not shown) and they are supplied through adjustable amplifiers 16 and 18 to an IQ modulator 32. From the IQ modulator 32, the signal passes through an amplifier 40 to an antenna 50. At a multichannel base station, several transceiver units are connected to a common TX antenna with a transmission adder (not shown).

An RX signal of a TRX unit at a base station of the GSM system is received with an antenna 52. At a multichannel base station, the antenna 52 is followed by a receiving multicoupler (not shown). The signal is supplied further through an amplifier 54, a mixer 56, a band-pass filter 60 and an amplifier 62 to a Received Signal Strength Indicator (RSSI) 22 in the baseband unit 1. It has been assumed above that the RSSI indicator 22 comprises an A/D converter. Otherwise, a separate A/D converter will have to be arranged before the RSSI indicator 22. With a suitable arrangement, antennas 50 and 52 can also be one and the same antenna. The reception mixer 56 is controlled by a local oscillator 58. The IQ modulator 32, in turn, is controlled by a transmission oscillator 34.

In this example, the IQ modulator mixes directly to the transmission frequency, but in the invention the IQ modulator may just as well mix first to an intermediate frequency, whereby there is a separate intermediate frequency stage between the IQ modulator and the transmission antenna 50.

For internal testing and adjustment of the TRX unit, the signal supplied to the transmission antenna is sampled with a directional coupler 42, and the sample is supplied through a TRX loop mixer 44 to a reception branch 54–62 with a directional coupler 48 for RSSI calculation. In the prior art transceiver equipment, the problem described in connection with FIG. 3 is solved by adjusting the equipment during manufacture such that a proportion of undesired signal components is minimal. An amplitude error can be corrected by adjusting the gain of amplifiers 16 and 18, and a phase error e.g. by adjusting the symmetry of the IQ modulator 32 in accordance with FIG. 2. This tuning action takes time. In addition, a tuning action performed does not protect against possible later drifting of component values.

SUMMARY OF THE INVENTION

The basic idea of the invention is that propagation of a signal with a nominal frequency, which here is frequency $f_{LO}+f_1$, from the digital part 10 through the loop part 44 and the reception branch 54–62 to the RSSI indicator 22 is prevented by changing the frequency response of a component found on the path of the signal. The same indicator 22 that normally measures the payload signal here measures only undesired signal components. After this, the amplitude and/or phase difference of branches I and Q is changed such that the measuring result obtained from the RSSI indicator 22 reaches its minimum. The correction signals obtained are stored in the memory, after which the frequency response of the system is restored to normal.

The method of the invention requires few additions and changes to the equipment contained in a radio station. The method is also very flexible, i.e. it can be implemented in many subareas of a transceiver. In addition, the method is very extensive, i.e. deflections of all the components of a transceiver from the ideal values are simultaneously taken into account therein. Further, the method is economical in that not all the components are necessarily adjusted, but the adjustment can be directed to a single component controlling the amplitude and/or a single component controlling the phase.

BRIEF DESCRIPTION OF THE DRAWINGS

In the following, the invention will be described in greater detail by preferred embodiments, with reference to the attached drawings, in which.

DETAILED DESCRIPTION OF THE PREFERRED EMBODIMENTS

Figure 4:
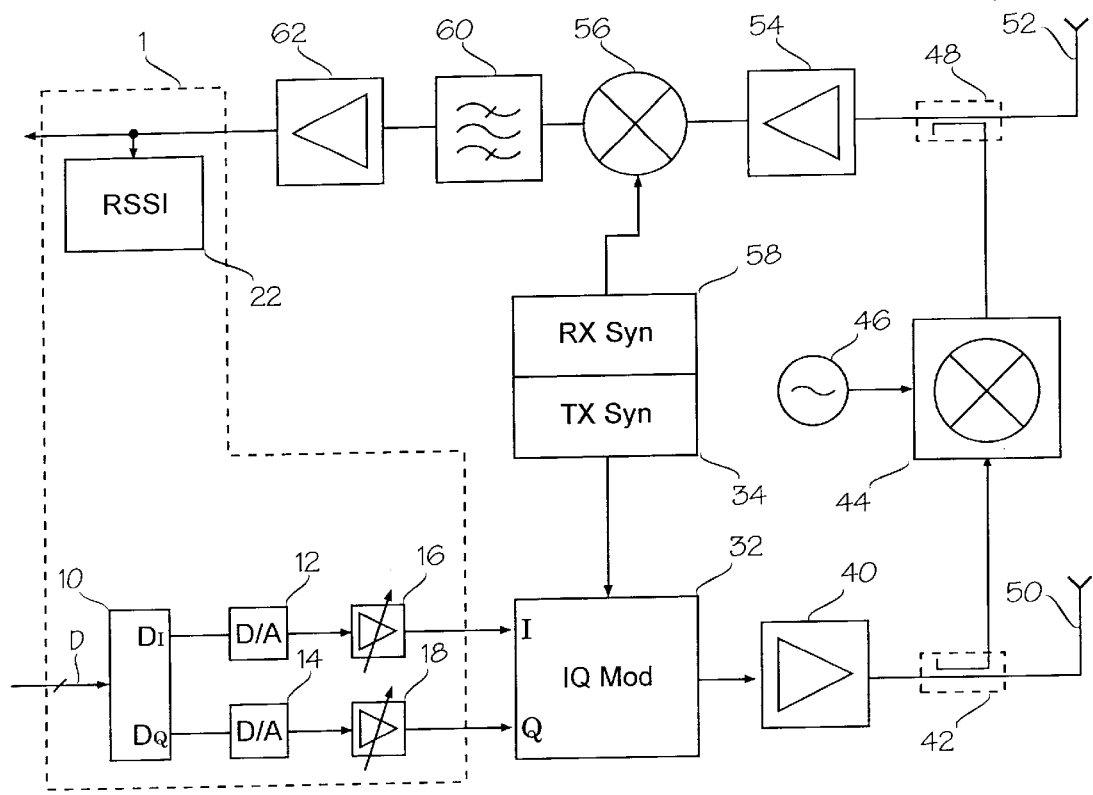
FIG. 4 shows part of a base station of the prior art.
Figure 5:
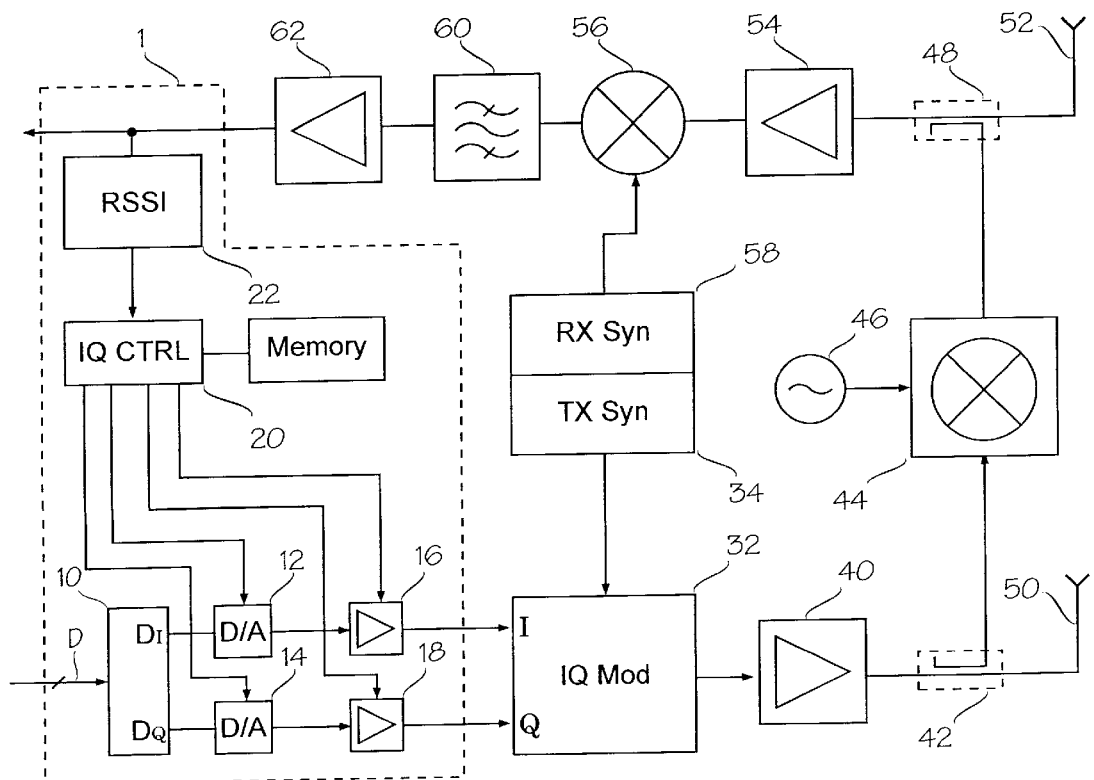
FIG. 5 shows a base station supplemented with a tuning part provided by the invention.

FIG. 5 shows a circuit presented in FIG. 4, supplemented with an IQ tuning part 20 and a memory 23 provided by the invention. In the invention, up-mixing is performed during the tuning phase by preventing the propagation of a signal with a nominal frequency, which here is frequency $f_{LO}+f_1$, from the IQ modulator 32 through the loop mixer 44 and reception branch 54–62 to RSSI calculation 22. A signal measured in this manner consists merely of frequencies that are undesired during the tuning phase. The measured RSSI signal level can be utilized in adjusting the IQ branches such that the received signal (which consists only of undesired frequencies) can be minimized.

The propagation of a nominal-frequency signal to the RSSI indicator 22 during the tuning phase can be prevented at least by (a) changing the frequency of a local oscillator of the IQ modulator 32, (b) changing the frequency of a local oscillator 46 of the TRX loop mixer 44, (c) changing the frequency of a local oscillator 58 of the reception mixer 56, or (d) changing the intermediate frequency of a band-pass filter 60. It is obvious that a nominal-frequency component of a signal can be attenuated for the duration of the tuning phase practically at any point where a suitable component adjustable by a control signal is provided by present technology.

Figure 1:
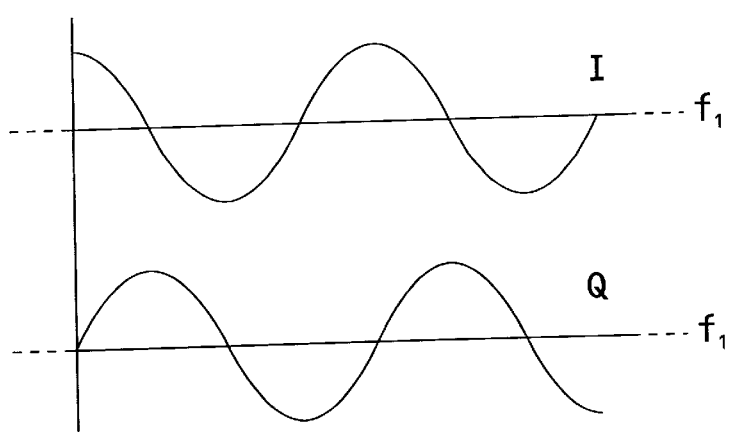
FIG. 1 shows signals I and Q at frequency $f_1$.
Figure 2:
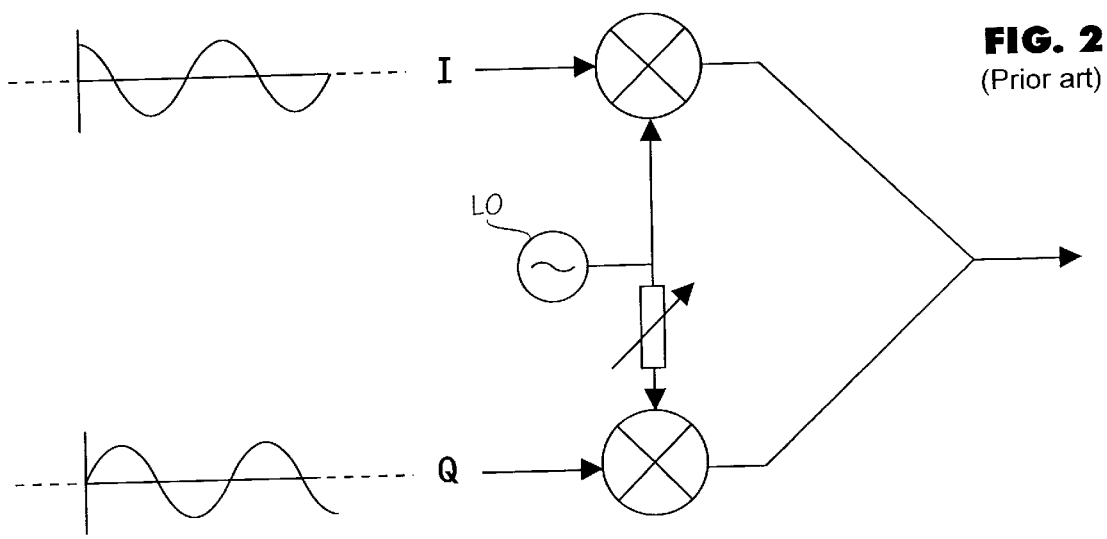
FIG. 2 shows a basic circuit arrangement of a mixer.
Figure 3:
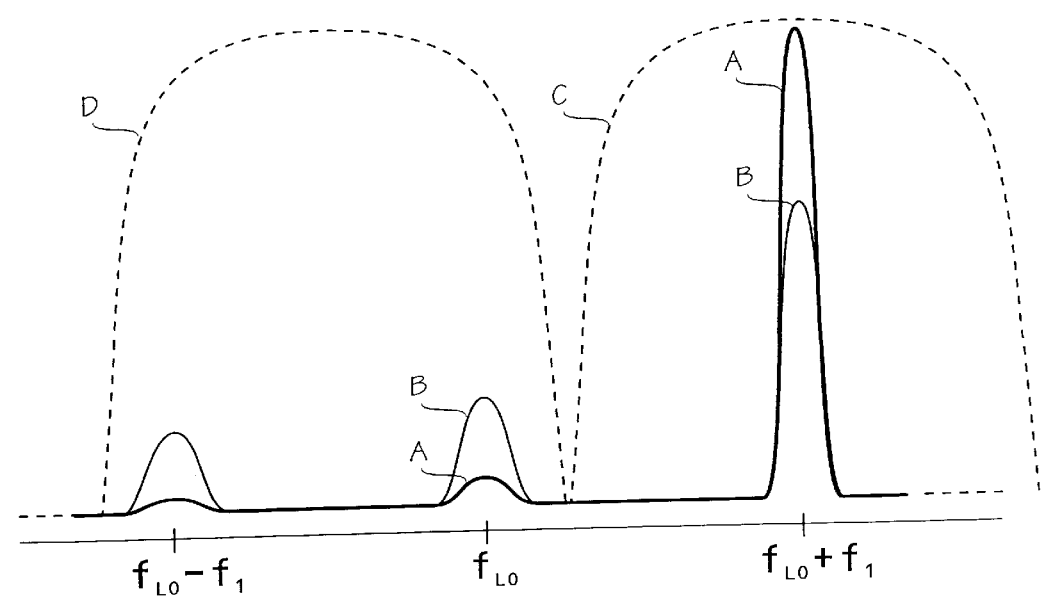
FIG. 3 illustrates two different mixing results.

Graph C in FIG. 3 illustrates the frequency response on the path of the signal from the baseband unit 1 through the loop mixer 44 and reception branch 54–62 to the RSSI indicator 22 when the system is in normal state. Graph D indicates the frequency response shifted for the duration of the tuning phase.

During the tuning phase, the amplitudes of signals I and Q should, in principle, are adjusted to be the same and the phase difference should be adjusted to be as close to 90° as possible. Since the IQ modulator is not ideal, a good mixing result can also be obtained such that a phase error of a certain magnitude compensates for an amplitude error of a certain magnitude. In the method of the invention, the errors that compensate for each other are automatically taken into account, and only errors that do not compensate for each other are corrected.

Although in the description of the invention, the phase or amplitude is stated to be tuned to both branch I and branch Q, it is obvious that tuning can also be implemented in one branch only, if a sufficient adjustment margin has been reserved therein.

Figure 6:
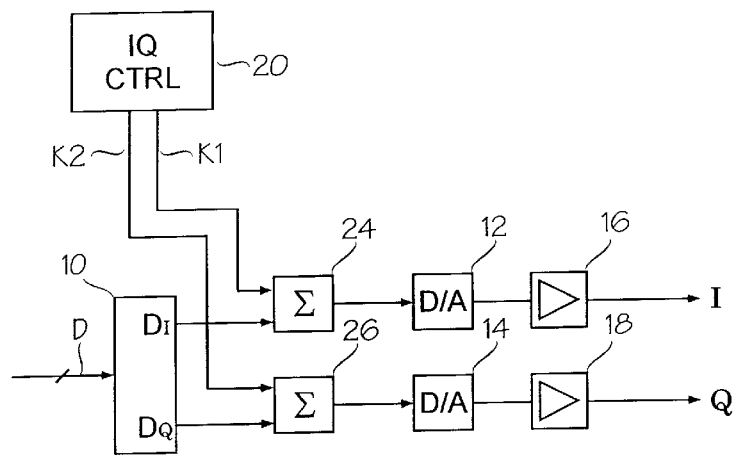
FIG. 6 illustrates a way of correcting the amplitude and phase error between signals I and Q with one and the same regulating element.

In the embodiment of FIG. 6, digital correction signals K1, K2 of the tuning part 20 are added to digital data D before D/A conversion. Digital correction signal K1 obtained from the tuning part 20 is added to bit stream $D_I$ with adder 24. Branch Q is adjusted in a corresponding manner with adder 26. Depending on the implementation of the digital part, adders 24 and 26 may be separate devices or software routines performed by a processor. When the amplitudes and phases of correction signals K1 and K2 are selected appropriately, both the amplitude and the phase error can be corrected by a circuit according to FIG. 6 using the same correction means.

Figure 7:
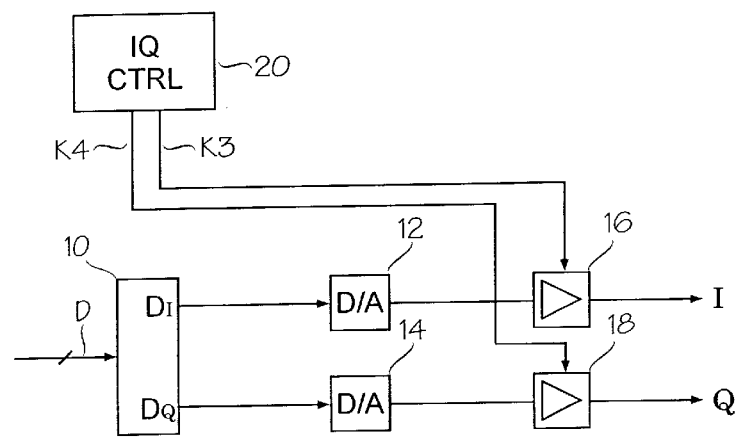
FIG. 7 illustrates a way of correcting the amplitude error between signals I and Q.

FIG. 7 shows a solution in which signals K3, K4 obtained from the IQ tuning part 20 are supplied to amplifiers 16, 18 as control signals. The gain of the amplifiers 16, 18 can be adjusted by external control, e.g. by voltage, current or digital control. The amplifiers 16, 18 may be separate amplifiers, or they may be integrated into D/A converters 12, 14.

Figure 8:
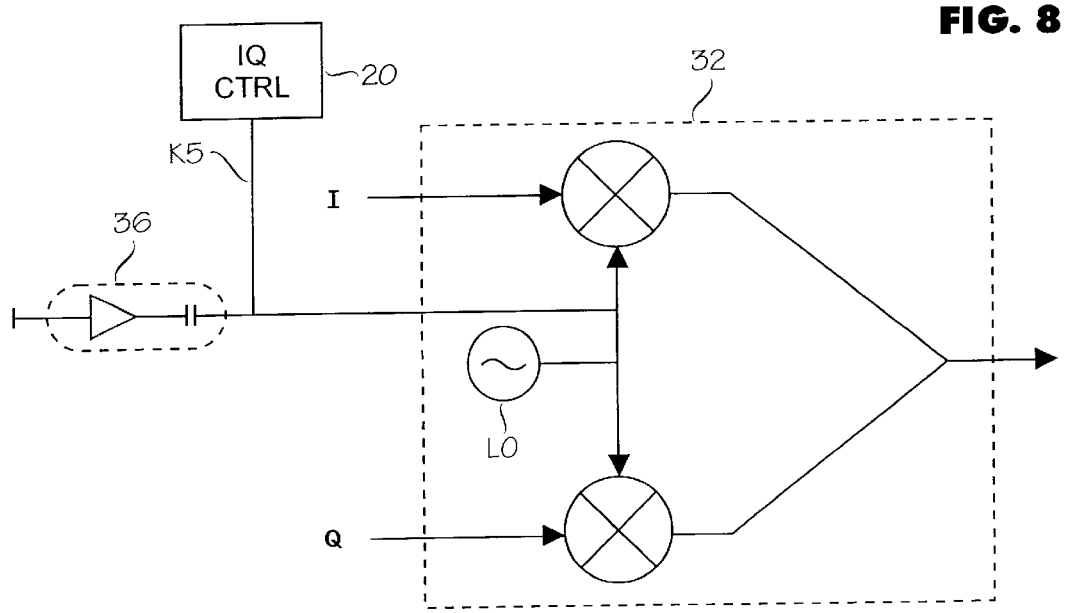
FIGS. 8 to 10 illustrate various ways of correcting the phase error between signals I and Q.

FIG. 8 illustrates an arrangement in which phase modulation is performed by modifying the mixing signal obtained from the local oscillator of the IQ modulator. In one branch is arranged an element, e.g. a capacitance diode 36, which can be adjusted by external control and the value of which can be adjusted by control voltage K5.

Figure 9:
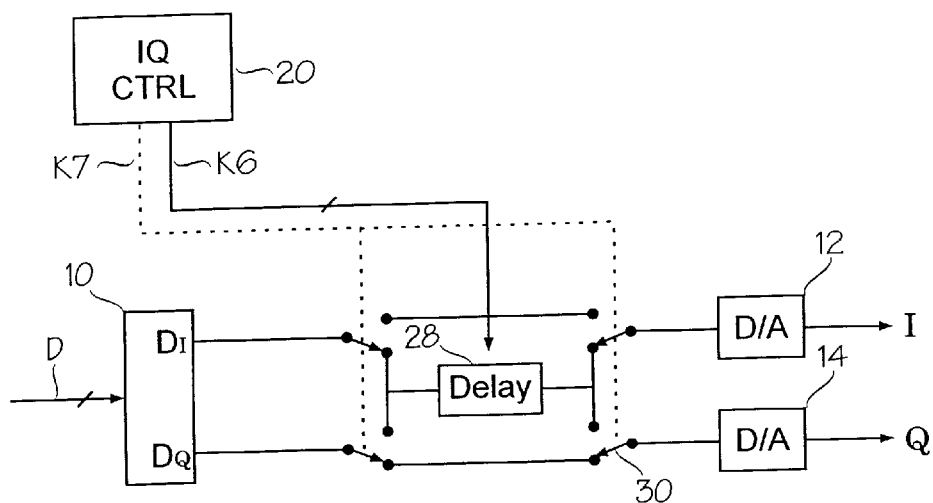
Figure 10:
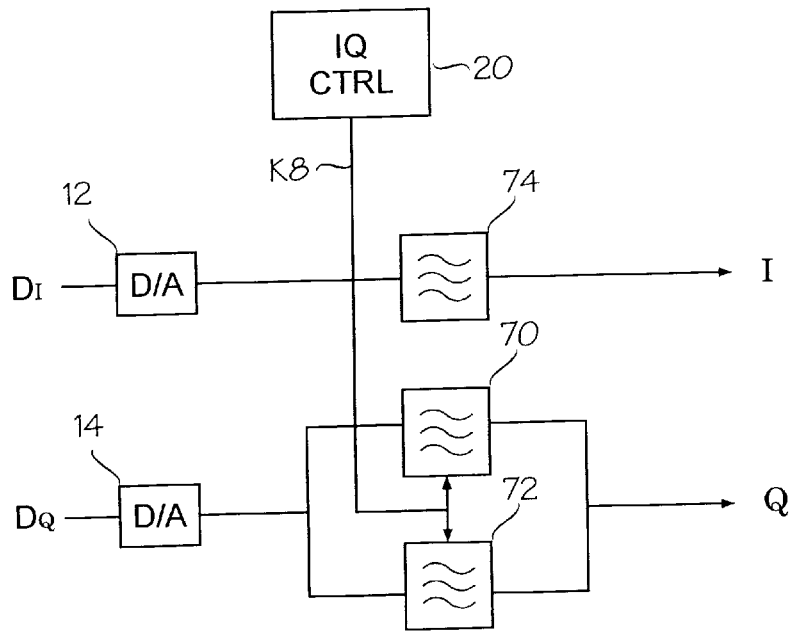

FIGS. 9 and 10 illustrate different ways of adjusting the phase difference between signals I and Q. in the solution of FIG. 9, the phase error is corrected such that an extra digital delay means 28 is added to the digital part, the means delaying the bit stream passing through it, depending on the value of digital control signal K6. In the embodiment of FIG. 9, there is only one delay means that can be arranged in a branch transmitting either bit stream $D_I$ or bit stream $D_Q$, according to the need, using a switch 30 responsive to control signal K7. It is obvious that a similar switch 30 arrangement can also be used in other embodiments in which signals I and Q are forwarded in different branches. The delay means 28 may be a physical device, e.g. a shift register, in which the number of shift stages can be controlled by an external digital control signal K6. Since a delay unit should be considerably smaller than the time corresponding to one data bit, a clock signal with a suitable frequency must be supplied to the delay means 28. In the implementation of the digital part, the delay means and the switch may also be software routines performed by a processor, whereby control signals K6, K7 are program parameters.

In the solution of FIG. 10, the phase error is corrected by coupling branches I and Q through voltage-controlled all-pass filters. An all-pass filter affects all frequencies in the same way. Thus it has no effect on the frequency response. Instead, the propagation time of a signal can be affected by the all-pass filter. In the embodiment of FIG. 10, the actual tuning takes place in branch Q, in which two all-pass filters 70, 72 are arranged, the control signals of the filters being formed such that when one increases, the other is reduced. To branch I is coupled an all-pass filter 74, the delay of which corresponds to the average delay of the filters in branch Q.

In the invention, a transmitter is tuned by:
  (i) preventing propagation of a signal having an essentially nominal frequency from the digital part (10) through the TRX loop part (44) to the RSSI indicator (22),
  (ii) adjusting at least one parameter affecting the amplitudes and/or phases of branches I and Q such that the signal strength indicated by the RSSI indicator (22) essentially reaches the minimum,
  (iii) storing the new values of the parameters changed in phase (ii) in a memory,
  (iv) restoring the propagation of the nominal-frequency signal changed in phase (i) from the digital part (10) through the TRX loop part (44) to the RSSI indicator (22).

To minimize the amplitude and phase errors, many algorithms known from control technology can be used. The simplest but also the most time-consuming implementation is a method of 'brute force', in which the signal for controlling the regulation element is simply adjusted until the signal indicated by the RSSI indicator reaches the minimum. Another alternative is e.g. to measure a number N of adjustment results as a function of control signal values; to calculate an Nth degree polynomial from these values, the polynomial approximating the adjustment result as a function of the control signals; to determine the control signal values corresponding to the minimum of this polynomial; and to set these values such that they influence the circuit.

When both the amplitudes and the phases of signals I and Q have been adjusted to be optimal, i.e. undesired signal components have been minimized, the control signal values are stored in the memory 23. The implementation of the memory means depends on the kind of tuning means that has been used. When an analogue signal generated by the IQ tuning part 20 with D/A converters is used for the adjustment, corresponding digital data is stored in that same memory where other parameter data of the radio station is stored. The tuning means may also comprise their own memory. Such means include e.g. motor driven adjustable resistors and capacitors, electrical potentiometers (EPOT), etc.

From control technology are known many ways of ensuring that the overall minimum, not just a local minimum, of an RSSI signal is found in the above-mentioned phase (ii) where control signal values are determined.

It is described above how a tuning part 20 is connected to a radio transceiver. The tuning part is naturally also connected to the Operation and Maintenance Section (OM) (not shown) of a radio station. The OM commands the tuning part to tune the radio transceiver at least in connection with installation and maintenance, but preferably also occasionally e.g. when traffic density is low or when the conditions, such as temperature, atmospheric pressure and/or humidity, change. Corresponding indicators must then naturally also be coupled to the OM Section.

It is obvious to a person skilled in the art that as the technology advances, the basic idea of the invention can be implemented with many different regulating elements. The invention and its embodiments are thus not limited to the above examples but may vary within the scope of the claims.

What I claim as my invention is:

1. A method of correcting at least one of phase and amplitude errors between I and Q branches in a radio transceiver utilizing phase quadrature modulation having a nominal frequency, the transceiver comprising:

a transmitter section comprising a digital section for dividing an input bit stream into two bit streams corresponding to the I and the Q branches, a D/A converter for each of the I and the Q branches, and IQ modulator having a local oscillator for combining the I and the Q branches into an output signal, and an output amplifier;

a receiver section comprising a reception mixer having a local oscillator, a band-pass filter having a center frequency, and an RSSI indicator for indicating a received signal strength; and a TRX loop mixer having a local oscillator, for supplying a frequency-shifted sample from the transmitter section to the receiver section;

the method comprising:

preventing propagation of signals of substantially nominal frequency and passing signals of undesired frequencies from the digital section via the TRX loop mixer to the RSSI indicator;

tuning a radio transmitter by adjusting at least one parameter affecting at least one of amplitude and phase of at least one of the I and the Q branches such that the signal strength of the undesired frequencies, as indicated by the RSSI indicator, substantially reaches a minimum;

storing, in a memory, values of the at least one parameter obtained during the tuning step; and restoring the propagation of the substantially nominal-frequency signals and blocking the signals of the undesired frequencies from the digital section through the TRX loop mixer to the RSSI indicator.

2. A method according to claim 1, wherein the tuning step comprises adjusting at least one component affecting the amplitude and at least one component affecting the phase of at least one of the I and the Q branches.

3. A method according to claim 1, wherein the preventing step comprises adjusting a frequency of the local oscillator of the IQ modulator.

4. A method according to claim 1, wherein the preventing step comprises adjusting a frequency of the local oscillator of the TRX loop mixer.

5. A method according to claim 1, wherein the preventing step comprises adjusting a frequency of the local oscillator of the reception mixer.

6. A method according to claim 1, wherein the preventing step comprises adjusting the center frequency of the band-pass filter.

7. A method according to claim 1, wherein the tuning step comprises adding digital correction data to a digital input signal of at least one of the D/A converters.

8. A method according to claim 1, wherein the tuning step comprises adjusting the amplitude of at least one of the I and the Q branches by a voltage or current-controlled amplifier.

9. A method according to claim 1, wherein the tuning step comprises adjusting the local oscillator of the IQ modulator.

10. A method according to claim 1, wherein the tuning step comprises adjusting a timing of at least one of the two bit streams corresponding to the I and the Q branches.

11. A method according to claim 1, further comprising providing the I and the Q branches with at least one all-pass filter having an adjustable propagation delay, wherein the tuning step comprises adjusting the propagation delay.

12. An automatically tunable radio transceiver utilizing phase quadrature modulation at a nominal frequency, the transceiver comprising:

a transmitter section comprising a digital section for dividing an input bit stream into two bit streams corresponding to I and Q branches, a D/A converter for each of the I and the Q branches, an IQ modulator having a local oscillator for combining the I and the Q branches into an output signal, and an output amplifier;

a receiver section comprising a reception mixer having a local oscillator, a band-pass filter having a center frequency, and an RSSI indicator for indicating a received signal strength;

a TRX loop mixer, having a local oscillator, for supplying a frequency-shifted sample from the transmitter section to the receiver section;

at least one first adjustable component being arranged, in response to a respective first control signal, to temporarily prevent a propagation of a nominal-frequency signal and to pass signals of undesired frequencies from the digital section via the TRX loop mixer to the RSSI indicator;

at least one second adjustable component being arranged, in response to a respective second control signal, to affect at least one of an amplitude and a phase of at least one of the I and the Q branches, such that the signal strength of the undesired frequencies, as indicated by the RSSI indicator, substantially reaches a minimum;

a memory for storing values associated with the first and the second control signals; and IQ tuning means for outputting the first and the second control signals while tuning a transmitter, and for storing into the memory the values associated with the second control signal for causing the RSSI indicator to substantially reach a minimum.

13. A radio transceiver according to claim 12, wherein the at least one first adjustable component is the local oscillator of the IQ modulator.

14. A radio transceiver according to claim 12, wherein the at least one first adjustable component is the local oscillator of the TRX loop mixer.

15. A radio transceiver according to claim 12, wherein the at least one first adjustable component is the local oscillator of the reception mixer.

16. A radio transceiver according to claim 12, wherein the at least one first adjustable component is a band-pass filter.

17. A radio transceiver according to claim 12, wherein at least one first adjustable component comprises means for adding digital correction data to at least one of the two bit streams.

18. A radio transceiver according to claim 12, wherein the at least one second adjustable component is a voltage- or current-controlled amplifier for adjusting the amplitude of at least one of the I and the Q branches.

19. A radio transceiver according to claim 12, wherein the at least one second adjustable component is the local oscillator of the IQ modulator.

20. A radio transceiver according to claim 12, wherein the at least one second adjustable component is a digital adder for adjusting a timing of at least one of the two bit streams.

21. A radio transceiver according to claim 12, wherein the at least one second adjustable component is at least one all-pass filter in series with at least one of the I and the Q branches.

22. An automatically tunable radio transceiver utilizing phase quadrature modulation at a nominal frequency, the transceiver comprising:

a transmitter section comprising a digital section for dividing an input bit stream into two bit streams corresponding to I and Q branches, a D/A converter for each of the I and the Q branches, an IQ modulator having a local oscillator for combining the I and the Q branches into an output signal, and an output amplifier;

a receiver section comprising a reception mixer having a local oscillator, a band-pass filter having a center frequency, and an RSSI indicator for indicating a received signal strength;

a TRX loop mixer, having a local oscillator, for supplying a frequency-shifted sample from the transmitter section to the receiver section;

at least one first adjustable component being arranged, in response to a respective first control signal, to temporarily prevent a propagation of a nominal-frequency signal and to pass signals of undesired frequencies from the digital section via the TRX loop mixer to the RSSI indicator;

at least one second adjustable component being arranged, in response to a respective second control signal, to affect at least one of an amplitude and a phase of at least one of the I and the Q branches, such that the signal strength of the undesired frequencies, as indicated by the RSSI indicator, substantially reaches a minimum;

a memory for storing values associated with the first and the second control signals; and an IQ tuner for outputting the first and the second control signals while tuning a transmitter, and for storing into the memory the values associated with the second control signal, for causing the RSSI indicator to substantially reach a minimum.

* * * * *